(12) United States Patent
Tanida et al.

(10) Patent No.: US 7,078,927 B2
(45) Date of Patent: Jul. 18, 2006

(54) SEMICONDUCTOR DEVICE CHARACTERISTICS MEASUREMENT APPARATUS AND CONNECTION APPARATUS

(75) Inventors: Shinichi Tanida, Tokyo (JP); Hiroyuki Shimizu, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/282,812

(22) Filed: Nov. 18, 2005

(65) Prior Publication Data

US 2006/0066343 A1    Mar. 30, 2006

Related U.S. Application Data

(62) Division of application No. 11/105,867, filed on Apr. 14, 2005, now Pat. No. 6,998,869.

(30) Foreign Application Priority Data

Apr. 16, 2004    (JP)    ............................. 2004-121198

(51) Int. Cl.
*G01R 31/26*    (2006.01)
(52) U.S. Cl. ...................................... 324/765
(58) Field of Classification Search .................... None
See application file for complete search history.

(56) References Cited

U.S. PATENT DOCUMENTS 4,618,818 A    10/1986   Horn ........................... 324/706
6,069,484 A     5/2000   Sobolewski et al. ......... 324/765
6,856,158 B1    2/2005   Frame et al. ................ 324/765
6,998,869 B1 *  2/2006   Tanida et al. ............... 324/765
2004/0208415 A1* 10/2004 Kim et al. ..................... 385/14

OTHER PUBLICATIONS

Hewlett Packard, "HP 4155B—Semiconductor Parameter Analyzer; HP 4156B—Precision Semiconductor Parameter Analyzer"; Technical Data, Jul. 1997, 10 pps.
Agilent Technologies, "Agilent E5250A—Low Leakage Swtich Mainframe", Technical Data, Dec. 1, 2000, 4 pps.
Agilent Technologies, "Agilent 4284A/4285A—Precision LCR Meter Family"; Technical Overview, Jan. 30, 2003, 28 pps.

* cited by examiner

*Primary Examiner*—Jermele Hollington
*Assistant Examiner*—Trung Q. Nguyen

(57) ABSTRACT

A semiconductor-device characteristic measurement apparatus includes first measuring means for measuring a first electrical characteristic of a device under test, second measuring means, switching means for switching between the first measuring means and the second measuring means such that one of the measuring means is connected to the device under test, and controlling means for controlling the switching means. The switching means includes switches that switch between a first wiring configuration for electrically connecting the first measuring means to the device under test and a second wiring configuration for electrically connecting the second measuring means to the device under test. The switching means is electrically connected to the device under test at a position closer to the device under test than the first measuring means and the second measuring means.

8 Claims, 12 Drawing Sheets

US 7,078,927 B2

SEMICONDUCTOR DEVICE CHARACTERISTICS MEASUREMENT APPARATUS AND CONNECTION APPARATUS

CROSS-REFERENCE TO RELATED APPLICATION

The present application is a divisional of U.S. patent application Ser. No. 11/105,867, filed on Apr. 14, 2005 U.S. Pat. No. 6,998,869, which claims priority of Japanese Patent Application No. 2004-121198, filed on Apr. 16, 2004. The content of the above applications is herein incorporated by reference.

BACKGROUND OF THE INVENTION

1. Field of the Invention

The present invention relates to a measurement apparatus for an electronic device. More specifically, the present invention relates to a measurement apparatus for semiconductor device characteristics of an integrated circuit device or discrete electronic circuit device, and to a connection apparatus used for such measurement.

2. Description of the Related Art

Conventionally, the related technologies shown in FIGS. 1 and 2 have been known as apparatuses for measuring the electrical characteristics of a device to be tested (or "device under test", hereinafter referred to as DUT), such as integrated circuit devices and discrete electronic circuit devices consisting of semiconductors.

FIG. 1 shows a known example of an apparatus for measuring electrical characteristics by causing a probe apparatus 100 to probe a DUT 50. In this known example, a current-voltage characteristic measurement unit 20 (or a source monitor unit or a source measure unit, which is hereinafter referred to as an "SMU"), an LCR (inductance-capacitance-resistance) meter 22, and a pulse generator 24, which are independent apparatuses, are provided in an equipment rack 200. In the SMU 20, a direct-current voltage source, a current source, a voltmeter, and an ammeter are integrated so as to be usable in an arbitrary combination. The LCR meter 22 can measure inductance, electrical capacitance, and resistance. The pulse generator 24 generates a pulse to be applied to the DUT 50. The SMU 20, the LCR meter 22, and the pulse generator 24 are connected to the probe apparatus 100, which probes specific electrical contacts and so on of the DUT 50, via respective independent measurement cables. In the known example, when measuring a different characteristic of the DUT 50, an operator manually replaces the wires used for measuring the DUT 50 to perform the measurement. Thus, this example has the advantage of being able to carry out measurement accurately, since an appropriate configuration can be used for each type of measurement. However, the example also suffers from the drawback that measurement operation is inefficient, since the operator needs to manually replace the connections.

FIG. 2 shows another known example in which a switching matrix 300 is combined with the SMU 20, the LCR meter 22, the pulse generator 24, and so on to perform measurement. In this example, appropriate control of the switching matrix 300 allows various types of measurement to be automatically performed. This configuration, however, has a problem in that it is difficult to accurately measure the electrical characteristics of the DUT 50. In addition, U.S. Pat. No. 6,069,484 discloses a technique that connects a plurality of SMUs via a switching matrix.

SUMMARY OF THE INVENTION

An object of the present invention is to accurately measure electrical characteristics of a DUT without the need for manually switching connections. In particular, the present invention is directed to, but is not limited to, a series of measurements, such as when multiple measurement items are switched for measurement.

The present inventors have discovered that the problems of the known examples result from the following causes. Namely, when a switching matrix is used for switching, the switching matrix is placed far from a DUT, so that the return current of a measurement signal is delayed in time or returns after making a detour. In addition, the feedback current path is connected to the feedback path of another measuring means. For a so-called Kelvin connection scheme, with a matrix structure used in the known technology, the outer shield conductor of a measurement cable is grounded at the entrance of the signal switching matrix. Further, the physical form of the matrix portion is large and thus a connection cable from the exit of the matrix to the DUT needs to be extended. Thus, the resistance, self-inductance, and mutual inductance of such cable affect the measurement.

The present invention provides a semiconductor device characteristics measurement apparatus. The measurement apparatus comprises: first measuring means for measuring a first electrical characteristic of a DUT, which is a semiconductor device; and second measuring means for measuring a second electrical characteristic of the DUT. The measurement apparatus further comprises switching means for switching between the first measuring means and the second measuring means such that one of the measuring means is connected to the DUT; and controlling means for controlling the switching means by supplying a control signal. The switching means comprises at least one switch that switches between a first wiring configuration for electrically connecting the first measuring means to the DUT and a second wiring configuration for electrically connecting the second measuring means to the DUT in accordance with the control signal supplied from the controlling means. The first wiring configuration is suitable for measuring the first electrical characteristic and the second wiring configuration is suitable for measuring the second electrical characteristic. The switching means is electrically connected to the DUT at a position closer to the DUT than the first measuring means and the second measuring means.

The present invention provides a connection apparatus for connecting a measurement apparatus and a DUT, which is a semiconductor device. The connection apparatus comprises switching means, connected to the DUT, for receiving a control signal from controlling means; a preamplifier connected to the switching means; first connectors that are connected to the preamplifiers and that are connectable to first measuring means for measuring a first electrical characteristic of the DUT; and at least one second connector that is connected to the switching means and that is connectable to second measuring means for measuring a second electrical characteristic of the DUT. The switching means comprises at least one switch that switches between a first wiring configuration for electrically connecting the first measuring means to the DUT via the first connectors and the preamplifiers and a second wiring configuration for electrically connecting the second measuring means to the DUT via the second connector in accordance with the control signal from the controlling means. The first wiring configuration is suitable for measuring the first electrical characteristic and the second wiring configuration is suitable for measuring the second electrical characteristic. The preamplifiers amplify current signals and/or voltage signals for the first measuring means.

When the measurement apparatus or the connection apparatus according to the present invention is used, various electrical characteristics can be measured in combination or by switching the characteristics. Examples of possible measurement include capacitance measurement for measuring the film-thickness of a gate oxide film of a MOS (metal oxide semiconductor) device and leakage-current measurement of the gate oxide film, inter-wire capacitance measurement of a wiring component of an integrated circuit device and inter-line leakage current measurement thereof, junction-capacitance measurement and IV (current-voltage) characteristic measurement of a bipolar transistor, multiple-electrical-characteristics measurement for evaluating the performance of a floating gate of a flash memory device, and characteristics measurement for evaluating deteriorating characteristics by applying various pulses when stress is applied to an integrated circuit device. The DUTs may take various forms, such as integrated circuit devices fabricated with a silicon wafer or the like, a TEG (test element group) for evaluating an integrated-circuit-device manufacturing process, or non-integrated discrete devices (e.g., transistor devices). A probe apparatus can be used for integrated circuits or the like and a fixture can be used for discrete devices.

In the measurement apparatus of the present invention, preferably, the switching means further comprises micro-current detecting means for detecting micro current flowing in the DUT. The switching means can switch among the first wiring configuration, the second wiring configuration, and a third wiring configuration in accordance with the control signal supplied from the controlling means. The third wiring configuration can electrically connect at least one of the first measuring means and the second measuring means to the micro-current detecting means, can electrically connect the micro-current detecting means to the DUT, and is suitable for measuring the micro current in the DUT. In the connection apparatus of the present invention, preferably, the preamplifiers may comprise micro-current detecting means for amplifying the current signals.

For measuring micro current, the switching means and the connection apparatus detect the micro current and the first measuring means and so on measure a transmission signal corresponding to the micro current. As a result, a path for detecting micro current that is susceptible to noise and so on is limited to a section between the DUT and the switching means and/or the connection apparatus. This makes it possible to measure micro current with accuracy.

When the first wiring configuration electrically connects the first measuring means to the DUT, the first wiring configuration, a first signal path from the first measuring means to the DUT may be accompanied by a first feedback path from the DUT to the first measuring means. The first feedback path corresponds to the first signal path. When the second wiring configuration electrically connects the second measuring means to the DUT, a second signal path from the second measuring means to the DUT may be accompanied by a second feedback path from the DUT to the second measuring means. The second feedback path corresponds to the second signal path.

An effective wiring configuration can be employed for the measuring means and the DUT, in accordance with the characteristics measured by the measuring means. For example, a Kelvin connection scheme is effective for measurement using a source monitor unit (SMU), and a four-pair-terminal configuration is effective for measurement using an LCR meter. In the present invention, such wiring configurations can be provided when the connection means is connected to the DUT via the switching means. Thus, when the switching means switches connections, measurement that is suitable for each measuring means can be performed.

In the measurement apparatus or the connection apparatus of the present invention, the switching means may comprise a first switching portion included in a first signal path connected to one terminal of the DUT and a second switching portion included in a second signal path connected to another terminal of the DUT. The first switching portion and the second switching portion can operate in conjunction with each other under control of the controlling means to switch between the first wiring configuration and the second wiring configuration.

The first switching portion and the second switching portion operate as the switching means in conjunction with each other by switching between signal paths connected to different terminals of the DUT. Thus, for example, when a probe apparatus or the like that has probe pins for corresponding different terminals of a DUT is used, the switching portions can be provided for respective signal paths via which signals are applied to the probe pins. Such a configuration makes it possible to use, for example, a configuration in which the length of wires in the probe apparatus is minimized, thereby allowing for high-accuracy measurement.

In the measurement apparatus or the connection apparatus of the present invention, the first switching portion and the second switching portion may have signal feedback terminals that are connectable with each other.

Connecting the ground terminals of the first and second switching portions provides a ground potential that is common to the first and second switching portions, resulting in a high accuracy measurement.

In the measurement apparatus or the connection apparatus of the present invention, the controlling means may be arranged together with at least one of the first measuring means and the second measuring means to control the switching means.

With this arrangement, the controlling means for controlling the first measuring means or the second measuring means can be used as controlling means for controlling the switching means. This makes it possible to provide a simplified configuration that can operate in conjunction with the controlling means.

In the measurement apparatus or the connection apparatus of the present invention, the controlling means can synchronize with operation of at least one of the first measuring means and the second measuring means to perform control such that the switching means performs a switching operation.

For example, when the first measuring means starts measurement, the switching means switches the configuration to the first wiring configuration in synchronization, and when the second measuring means starts measurement after stopping the measurement performed by the first measuring means, the switching means switches the configuration to the second wiring configuration in synchronization. This allows for appropriate switching between measurements performed by the first measuring means and the second measuring means.

In the measurement apparatus of the connection apparatus of the present invention, one of the first measuring means and the second measuring means can comprise at least one of an impedance measurement unit, a pulse generator, and a current-voltage characteristic measurement unit.

The impedance measurement unit can be, for example, an inductance meter that measures inductance L, capacitance C, and resistance R. The source monitor unit (SMU) can be a unit in which a direct-current voltage source, current source, voltmeter, and ammeter are integrated so as to be usable in an arbitrary combination. With such a configuration, equipment provided with an impedance measurement unit, a pulse generator, and a source monitor can be used to perform measurement through appropriate switching while maintaining measurement accuracy.

The present invention further provides a connection apparatus. The connection apparatus comprises a first triaxial connector and a second triaxial connector that are to be connected to a DUT, which is a semiconductor device; a first coaxial connector, a second coaxial connector, and a third triaxial connector that are to be connected to measuring means for measuring an electrical characteristic of the DUT; and micro-current detecting means having a first output, a second output, a first input, a second input, resistors connected to the first input, and buffer amplifiers for transmitting respective voltages across the resistors to the first output and the second output. The connection apparatus further comprises switching means for switching between connection configurations connected to the first coaxial connector, the second coaxial connector, and the third coaxial connector; and a control input terminal that is connectable to controlling means for controlling the switching means. For measuring alternating current, under control of the controlling means through the control input terminal, the switching means establishes connections such that core lines of the first and second coaxial connectors are interconnected and are connected to the core line of the first triaxial connector, and outer shield conductors of the first and second coaxial connectors are interconnected and are connected to guard conductors of the first and second triaxial connectors. Each guard conductor is disposed between the core line and an outer shield conductor of each triaxial connector. For measuring direct-current voltage current, the switching means establishes connections such that a core line of the third triaxial connector is connected to the core line of the first triaxial connector, the core line of the second triaxial connector is connected to the first output via the second input of the micro-current detecting means, and a guard connector of the third triaxial connector is connected to the guard conductors of the first and second triaxial connectors. For measuring micro current, the switching means establishes connections such that the core line of the first triaxial connector is connected to the first input of the micro-current detecting means to cause the buffer amplifiers to output the respective voltages across the resistors as first and second outputs.

The connection apparatus having the configuration described above is connected to the DUT via the first and second triaxial connectors and is connected to the measuring means via the first coaxial connector, the second coaxial connector, and the third triaxial connector. Further, an external controlling means can be employed to switch among measurement of the alternating current, DC-voltage current or the micro current using the measuring means. Depending on the measurement to be carried out, a single connection apparatus having the configuration described above can be used to connect the device under test and the measuring means, or multiple connection apparatuses having the same configuration described above can be used so that they are provided to form pairs with the respective measurement electrodes of the DUT and respective measurement units.

According to the present invention, it is possible to configure a measurement system that offers enhanced convenience in measurement and that provides increased measurement accuracy compared to the known examples described above. In addition, since the micro-current detecting means is located in the vicinity of the DUT, it is possible to accurately measure a minute current range as small as femto-amperes or less.

When the connection apparatus is connected to a pulse generator, a waveform with less distortion can be supplied to the DUT during measurement with the pulse generator. When the SMU performs power supply and control for the switching portions, it is possible to efficiently switch between DC measurement performed by the SMU and measurement performed by the LCR meter, thereby preventing the switching function from adversely affecting the micro-current measurement function.

DESCRIPTION OF THE PREFERRED EMBODIMENTS

Preferred embodiments according to the present invention will be described below with reference to the accompanying drawings.

[Basic Configuration]

Figure 3:
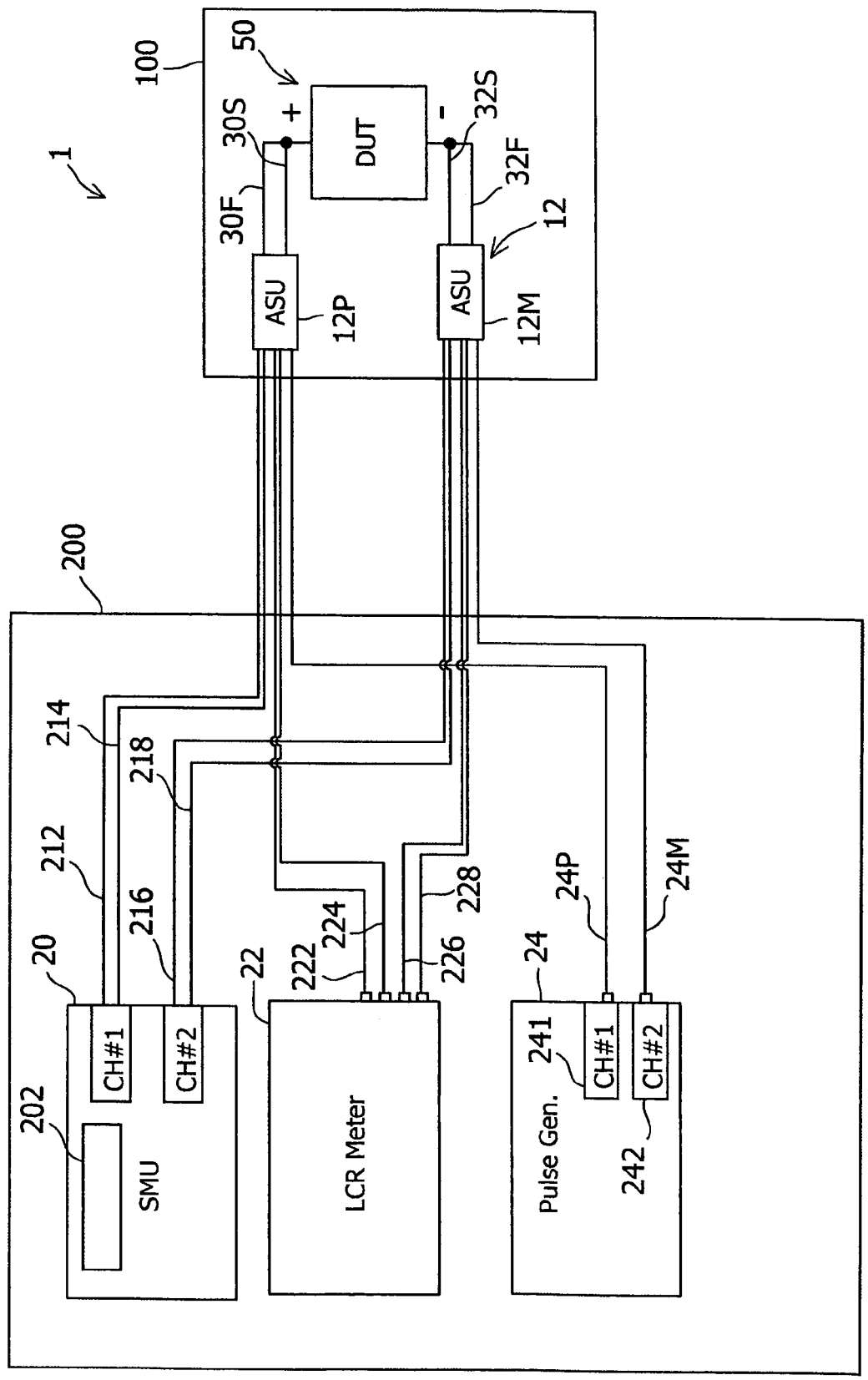
FIG. 3 is a block diagram showing the configuration of a semiconductor-device characteristic measurement apparatus according to an embodiment of the present invention.

FIG. 3 is a block diagram showing the configuration of an embodiment for measuring capacitance in the present invention. FIG. 3 shows a block configuration in which an SMU (source monitor units or source measure unit) 20, an LCR (inductance-capacitance-resistance) meter 22, and a pulse generator 24, which are mounted in an equipment rack 200, are used to measure electrical characteristics of a DUT (device under test) 50. The DUT 50 is mounted on a probe apparatus 100 so as to be probed. For convenience, the terms "positive (+) side" and "negative (−) side" are used for terminals of the DUT 50 and apparatuses to distinguish between its connections therewith. These expressions, however, are not particularly intended to mean a high potential and a low potential.

A switching portion 12 has an atto (attoampere) sense unit 12P (hereinafter referred to as an "ASU"), used for connection with the positive side of the DUT 50, and an SMU 12M, used for connection with the negative side of the DUT 50. The ASUs 12P and 12M have built-in functions for enabling switching and also functions (provided by micro-current detecting means) for measuring micro current.

The SMU 20 is a unit in which a direct-current voltage source, current source, voltmeter, and ammeter are integrated so as to be usable in an arbitrary combination. The SMU 20 typically has two operation modes. One is a mode in which a voltage is applied to measure a current and the other is a mode in which current is applied to measure a voltage. The SMU 20 has a first channel and a second channel, both of which are combined to perform measurement. The SMU 20 may include a controller (i.e., controlling means) 202 for controlling the ASU 12. In such a case, the controller 202 is connected to the ASUs 12P and 12M via cables 214 and 218 so as to control the ASUs 12P and 12M. Each of the first and second channels of the SMU 20 has two types of connection terminals, i.e., a force terminal and a control terminal, in order to realize Kelvin connection. The force terminals can be connected to triaxial cables, and the control terminals include current detection lines and supply power to and control the ASU 20. A typical SMU uses force terminals and sense terminals to perform measurement, but the SMU 20 in the present embodiment does not use sense terminals. Alternatively, the control terminals include the current detection lines to allow measurement.

The force terminal of the first channel of the SMU 20 is connected to the ASU 12P via a cable 212 and the control terminal of the first channel is connected via the cable 214. The force terminal of the second channel of the SMU 20 is connected to the ASU 12M via a cable 216 and the control terminal of the second channel is connected via the cable 218.

The LCR meter 22 is measuring means that can typically measure impedance and can measure L (inductance), C (capacitance), and R (resistance) for various applied waveforms and under various conditions. That is, the LCR meter 22 is measuring means that can serve as inductance measuring means, capacitance measuring means, and resistance measuring means. The LCR meter 22 is connected to the ASU 12P and the ASU 12M via a positive (high) side current cable 222, a positive (high) side voltage cable 224, a negative (low) side current cable 226, and a negative (low) side voltage cable 228.

The pulse generator 24 is means that can generate various pulse voltages to be applied to the DUT 50. The pulse generator 24 is connected to the ASU 12P and the ASU 12M via a positive-side cable 24P and a negative-side cable 24M, respectively.

The DUT 50 is, but is not limited to, a semiconductor device, such as a transistor, or a device of a TEG (test element group) or the like fabricated with a silicon wafer and used for determining the optimum process conditions for manufacturing integrated circuits. The DUT 50 is connected to the ASU 12P via cables 30F and 30S and is also connected to the ASU 12M via cables 32F and 32S.

Figure 4:
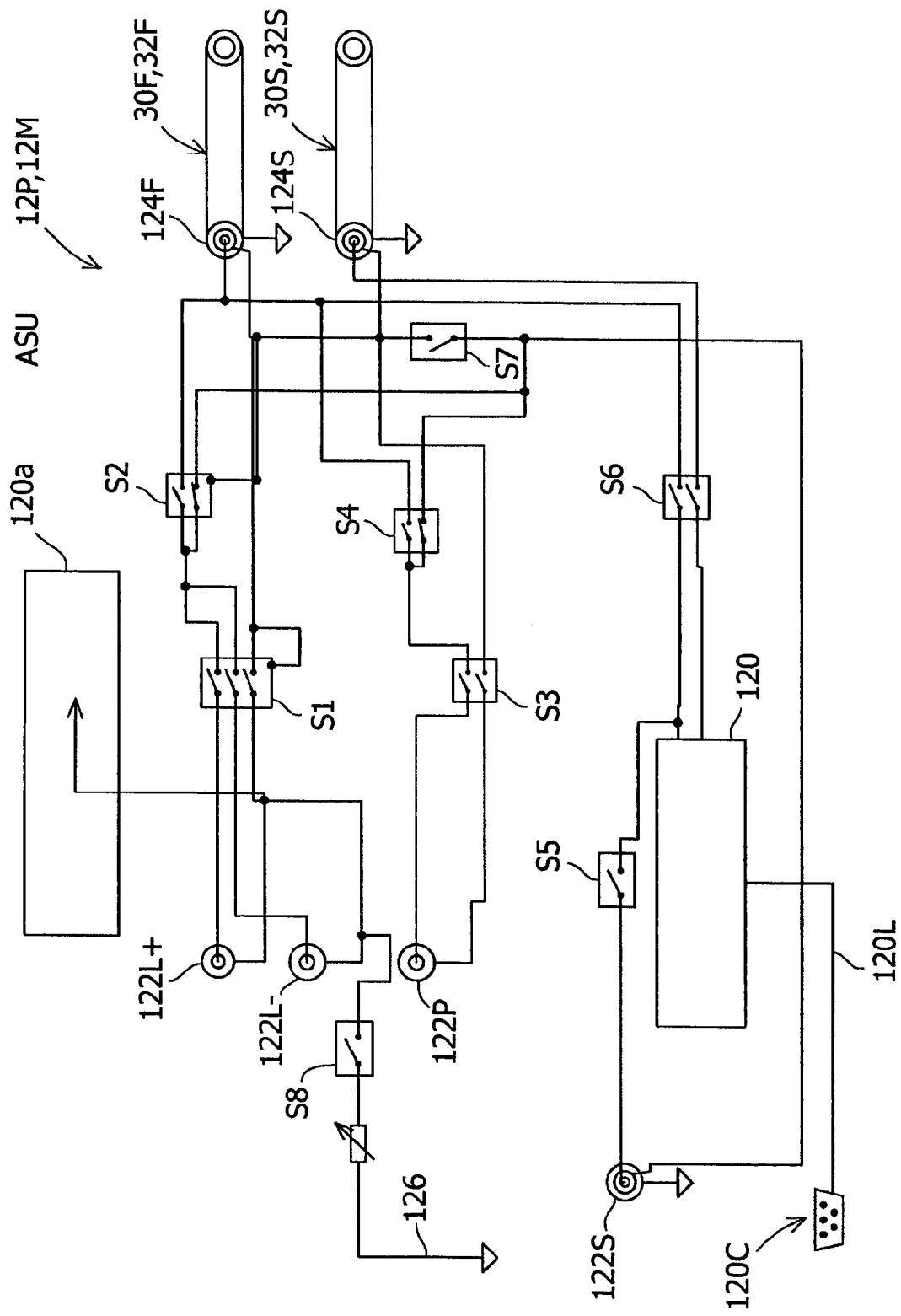
FIG. 4 is a block diagram showing a configuration of switching means in the embodiment of the present invention.

As shown in FIG. 3, what are used in the present embodiment are the first measuring means (i.e., the SMU 20) for measuring an electrical characteristic of the DUT 50, the second measuring means (i.e., the LCR meter 22 or the pulse generator 24) for another electrical characteristic of the DUT 50, and the switching portion 12 (i.e., the ASUs 12P and 12M) that is connected to the controlling means (i.e., the controller 202) and that has micro-current detecting means (i.e., a micro-current detector 102 shown in FIG. 4). The switching portion 12 is placed in the probe apparatus 100 at a position that is far from those measuring means and that is the closest to the DUT 50, and is electrically connected to the DUT 50. The switching portion 12 is also electrically connected to the multiple measuring means via the cables to switch between the first measuring means and the second measuring means such that one of the measuring means is electrically connected to the DUT 50, in accordance with a control signal supplied from the controlling means (i.e., the controller 202). The switching portion 12, which has the micro-current detectors 120, can be connected to ground at the probe apparatus 100.

Although FIG. 3 shows a case in which all the measurement units mounted in the equipment rack 200 are connected to the DUT 50 via the probe apparatus 100, the present invention also includes the case, as described below, where two measurement units required for measurement are connected to the DUT 50. That is, the present invention also includes the case in which any two of the three illustrated measuring units are used.

The configuration of the ASUs 12P and 12M of the switching portion 12 will now be described with reference to FIG. 4. The use of the ASUs 12P and 12M allows a switching operation between, for example, (1) the measurement of voltage and current using the SMU 20, (2) the measurement of capacitance using the LCR meter 22, and (3) the measurement of pulses using the pulse generator 24.

The ASUs 12P and 12M have a switching function and also have the respective micro-current detectors 120. The switching function is achieved by selectively opening closing connection pieces included in relay switches S1 to S8. These switches S1 to S8 are controlled by the controlling means 202 (shown in FIG. 3). Referring to FIG. 3, the cables 214 and 218, which extend from the SMU 20, represent control signal lines A connector 120C provides connection for a control line, not shown, between the controlling means 202, which controls the switches S1 to S8, and the corresponding ASU 12P or 12M. Further, a line that serves as an output for the micro-current detector 120 and that serves as an input for the SMU 20 is connected to the connector 120C. FIG. 4 illustrates only a line 120L that couples the connector 120C and the micro-current detector 120, but lines for controlling the switches S1 to S8 are also included in the present embodiment. The relay switches S1 to S8 of ASU 12P and 12M switch between electrical connection and electrical insulation for connectors 122L+, 122L−, 122P, and 122S (connecting means) located at the measuring-means side, connectors 124F and 124S, the micro-current detector 120, and ground 126, which are located at the DUT 50 side. In particular, the embodiment of the present invention can also switch between current feedback paths for those measuring means at the same time when performing switching between the signal paths. In this manner, the feedback paths that accompany the signal paths allow feedback current to be appropriately fed back to intended paths. Further, the micro-current detector 120 has a function for sensing micro current. A connection terminal 120a is also provided, such that it forms a feedback path for the measuring means that is connected to the connectors 122L+ and 122L−, when the connector 124S is not connected.

Figure 12:
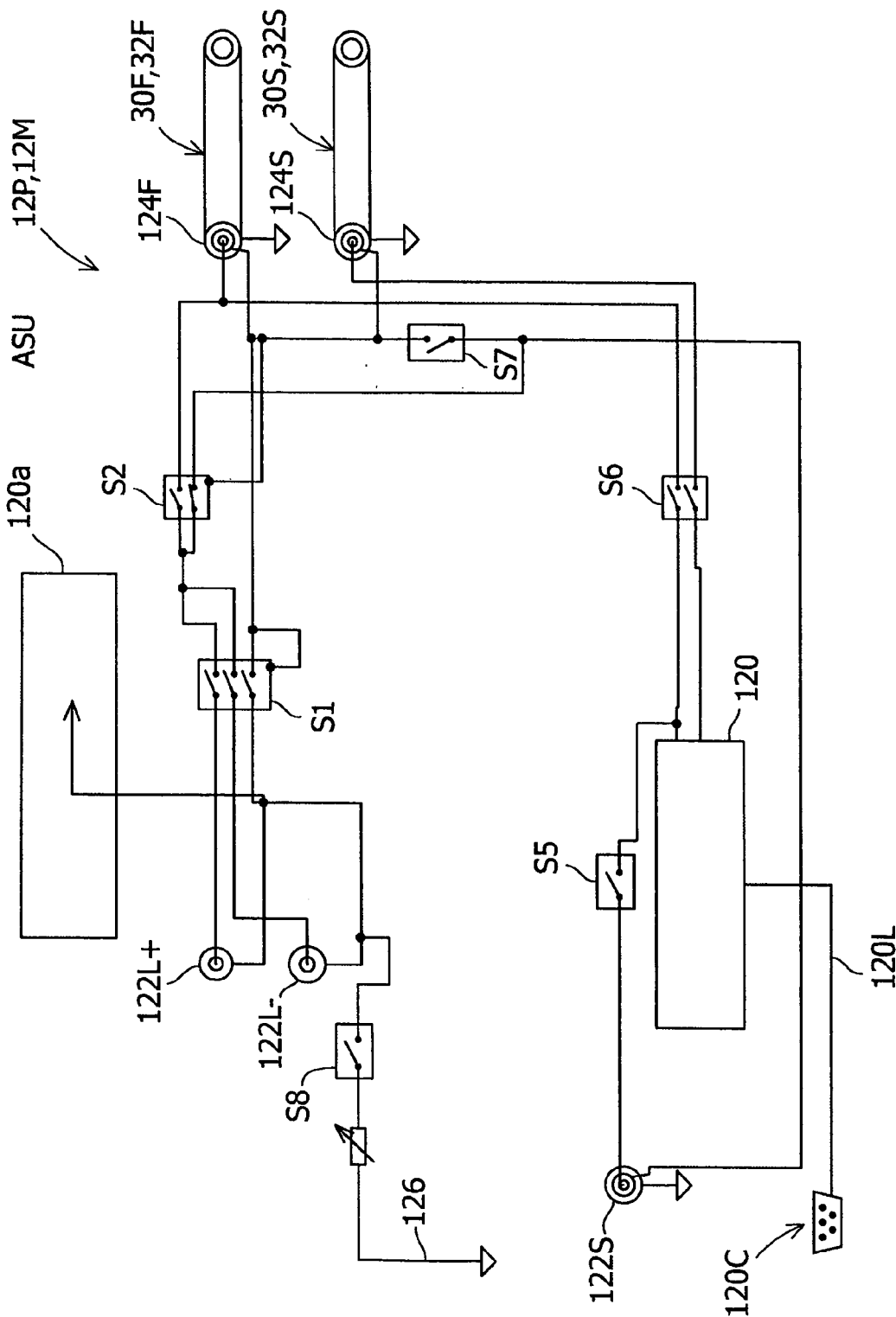
FIG. 12 is a block diagram showing another configuration of the switching means in the embodiment of the present invention.

FIG. 4 illustrates the configuration of ASUs to which three measuring means, as shown in FIG. 3, are connected. However, when two measuring means are connected to the ASUs at the same time, some inputs at the measuring means can be eliminated. The configuration of such a case is shown in FIG. 12. In the configuration shown in FIG. 12, the connector 122P, the switches S3 and S4, and the connection lines coupling the connector 122P and the switches S3 and S4 are not provided. In this case, a function equivalent to that of the connector 122P and the switches S3 and S4 is realized by the switches S1 and S2 and either the connector 122L+ or the connector 122L−.

In the present invention, it is also possible to measure a current large enough not to require the use of the micro-current detectors 120. In this case, a wiring configuration for measurement using the SMU 20 is employed. The wiring configuration for measurement using the micro-current detectors 120 and the wiring configuration for measurement using the SMU 20 can be switched by opening closing the switches S5 and S6. The controller 202 of the SMU 20 controls the supply of power to the micro-current detectors 120 of the ASUs 12P and 12M, the supply of operation power to the switches, and the operation of the switches.

[For Impedance Measurement]

Figure 5:
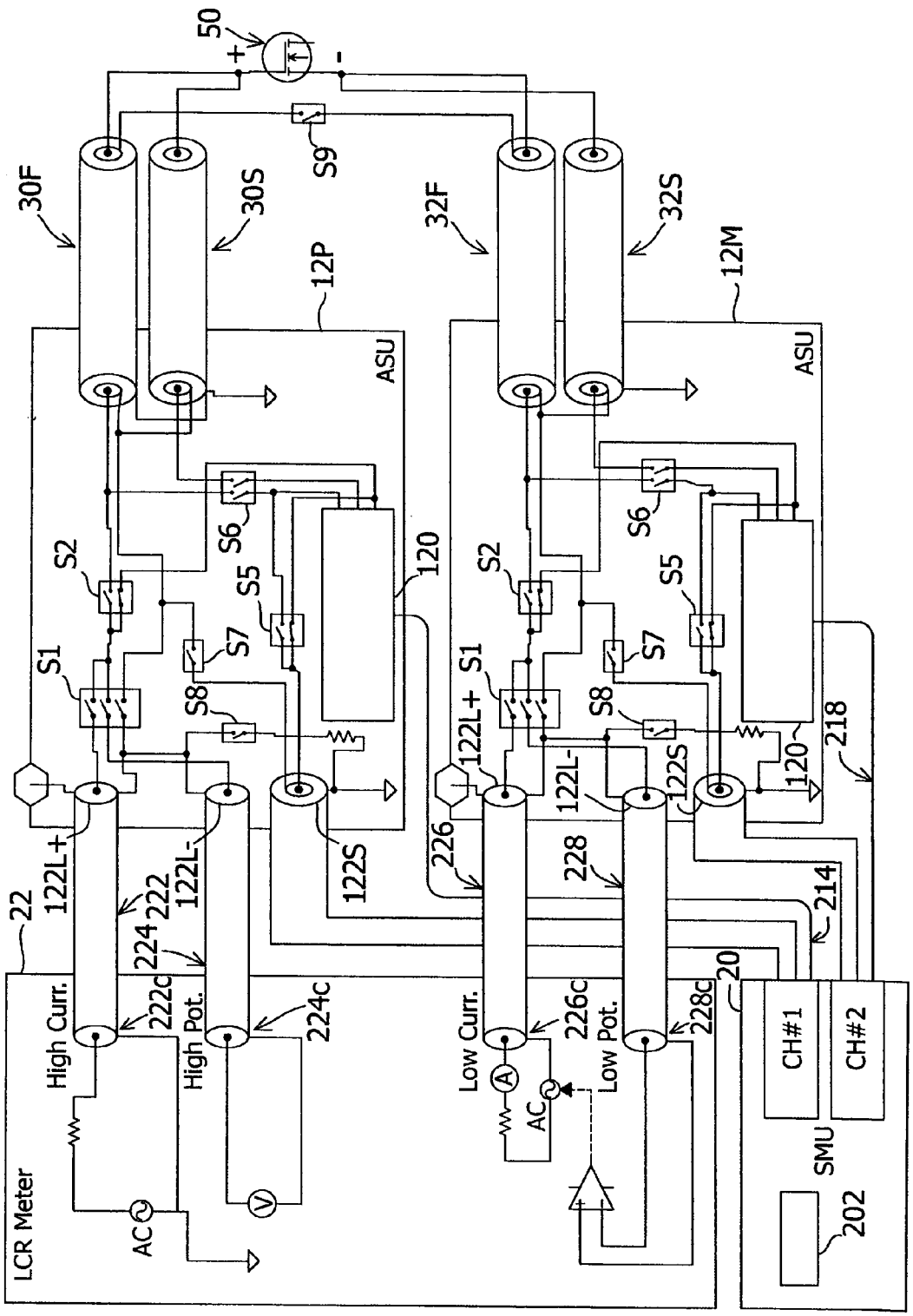
FIG. 5 is a block diagram showing the configuration of a measurement apparatus and a connection apparatus when an LCR meter and an SMU are used in the embodiment of the present invention.
Figure 6:
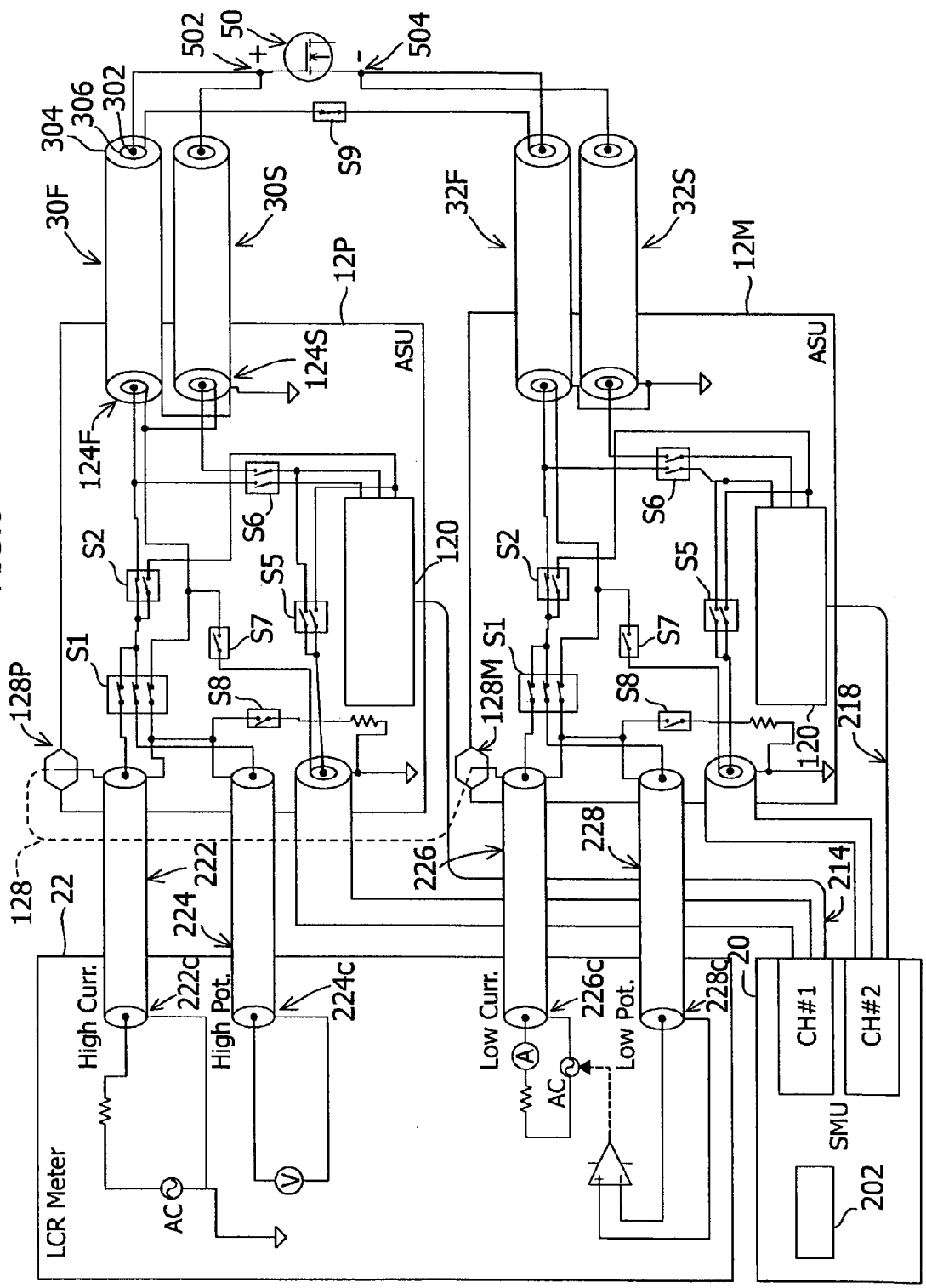
FIG. 6 is a block diagram showing the connection of the measurement apparatus and the connection apparatus when the LCR meter in the embodiment of the present invention performs measurement.
Figure 7:
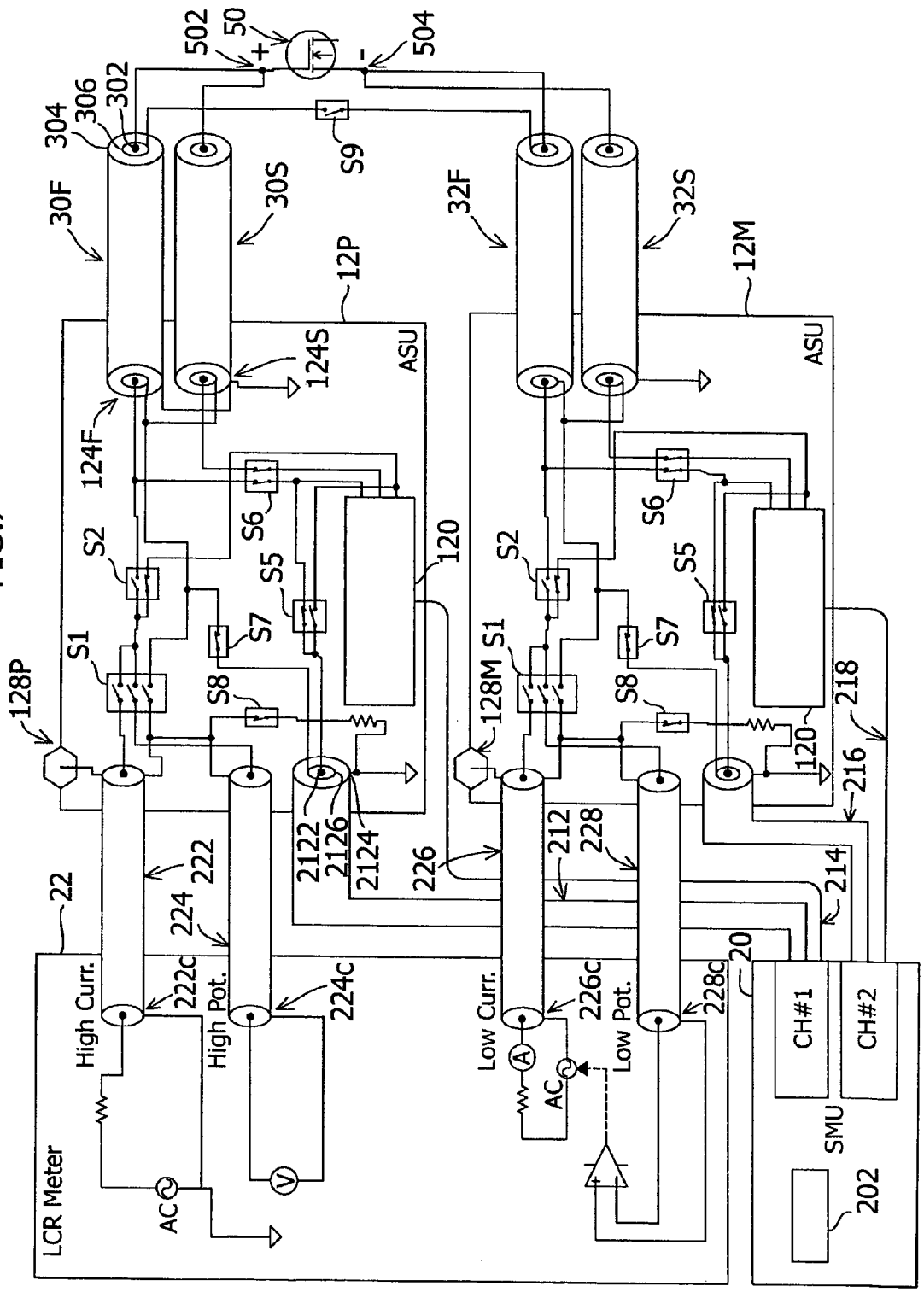
FIG. 7 is a block diagram showing the connection of the measurement apparatus and the connection apparatus when the SMU in the embodiment of the present invention performs measurement.

An example for measuring impedance using the LCR meter 22 and the SMU 20 in the present embodiment will now be described with reference to FIGS. 5 to 7. FIG. 5 shows the circuit configuration of this example and FIG. 6 illustrates the operation of the ASUs 12P and 12P when the LCR meter 22 is used to perform measurement. FIG. 7 illustrates an operation when the SMU 20 is used to perform measurement. Although the connector 122P and the relay switches S3 and S4 are not shown in the figures illustrated below as in FIG. 12, the connector 122P and the relay switches S3 and S4 may also be included and such a configuration also allows the ASUs to perform switching in the present embodiment. Also, the probe apparatus 100 and the equipment rack 200 are not shown.

In the present embodiment shown in FIGS. 5 and 6, for example, an LCR meter for performing four-terminal-pair measurement can be used, such as Agilent 4284A manufactured by Agilent Technologies Inc. The LCR meter 22 has an HC (high current) connector 222C for supplying an alternating-current (AC) signal to the high (+) side connector of the DUT 50; an HP (high potential) connector 224C for monitoring a voltage at the high-side connector of the DUT 50; an LC (low current) connector 226C, connected to the low (−) side of the DUT 50, for measuring current flowing therethrough; and an LP (low potential) connector 228C for monitoring a voltage at the low (−) side connector of the DUT 50. In the present embodiment, the connectors 222C and 224C are connected to the ASU 12P via cables 222 and 224, respectively, and the connectors 226C and 228C are connected to the ASU 12M via cables 226 and 228, respectively.

In the LCR meter 22, coaxial cables can be used for the cables 222 and 228 connected to the corresponding connectors 222C and 228C. In this case, the configuration is such that feedback currents for the connectors 222C to 228C are returned to the LCR meter 22 via the respective outer shield conductors of the coaxial cables 222 to 228. Thus, the current in the center conductor and the current in the outer shield conductor flow in directions opposite to each other and are the same in magnitude. In this case, since the magnetic fields generated by both currents cancel each other out, no magnetic field is generated around the conductors. That is, no magnetic field is induced by the measurement-signal current. Thus, error is not increased by the self inductance of measurement paths to the DUT 50 or the mutual inductance of the lead lines, so that measurement can be accurately performed. In the present embodiment, coaxial cables may be used for the cables 222 to 228. In the LCR meter 22, the center conductor and the outer shield conductor of the LC connector 226C have voltages that are both maintained at ground-potential by an automatic bridge circuit. The LCR meter 22 determines the ratio of a DUT-terminal voltage observed at the HP connector 224C to a DUT current observed at the LC connector 226C. As a result, the impedance of the DUT 50 can be determined.

Also, a pair of lines coupled to the center conductors of the HC connector 222C and the HP connector 224C and a pair of lines coupled to the center conductors of the LC connector 226C and the LP connector 228C may be connected, in close vicinity of the DUT 50, to the positive-side connector and the negative-side connector of the DUT 50, respectively. This arrangement can avoid measurement errors caused by a drop in voltages generated by the resistances of the cables and measurement currents (typically, such measurement is called four-terminal-pair measurement).

Next, current paths for a case in which the LCR meter 22 is used to perform measurement in the present invention will be described with reference to FIG. 6. In the present embodiment, the cables 30F, 30S, 32F, and 32S used for performing measurement on the DUT 50 are triaxial cables, which have a structure in which three types of conductors are coaxially arranged. Specifically, each of the cables 30F, 30S, 32F, and 32S has a center-conductor 302 disposed at the center, a tube-shaped outer shield conductor 304 that covers the outmost side of the cable, and a tube-shaped guard conductor 306 that is disposed inside the outer shield conductor and outside the center conductor 302 and that covers the center conductor 302.

In the present embodiment, the controlling means 202 of the SMU 20 controls the opening and closing of the relay switches S1 to S8 of the ASUs 12P and 12M via the cables 214 and 218. In this case, the combination of the opening and closing of the relay switches S1 to S8 is adapted to form a feedback path such that all feedback current returns to the LCR meter 22. That is, current that is applied and flows in the center conductor of the coaxial cable 222, which is connected to the HC connector 222C shown in FIG. 6, flows to the center conductor 302 of the triaxial cable 30F via a channel formed by closing the switches S1 and S2 in the ASU 12P. The current is supplied to a positive-side measurement portion 502 of the DUT 50 via a probe pin of the probe apparatus 100. Feedback current for the HC connector 222C flows through the switch S9 disposed adjacent to the DUT 50 and returns to the HC connector 222C via the guard conductor 306 of the triaxial cable 30F. The current then flows through a channel formed by closing the switch S1 and returns to the HC connector 222C via the outer shield conductor of the coaxial cable 222. The center conductor of the cable 224, which is connected to the HP connector 224C, is electrically connected to a connection path that leads to the center conductor of the coaxial cable 222 via the switch S1. The outer shield conductor of the cable 224, which is connected to the HP connector 224C, is electrically connected, inside the ASU 12P, to the outer shield conductor of the cable 222. The switches are controlled as described above to provide a wiring configuration suitable for measuring the LCR meter 24. As a result, it is possible to accurately measure a voltage via the HP connector 222C.

In the same manner in which the HC connector 222C and the HP connector 224C are connected to the positive-side measurement portion of the DUT 50 and the switch S9, the LC connector 226C and the LP connector 228C are connected to a negative-side connection portion 504 of the DUT 50 and the switch S9 via the ASU 12M that is in the same state as the ASU 12P.

Figure 1:
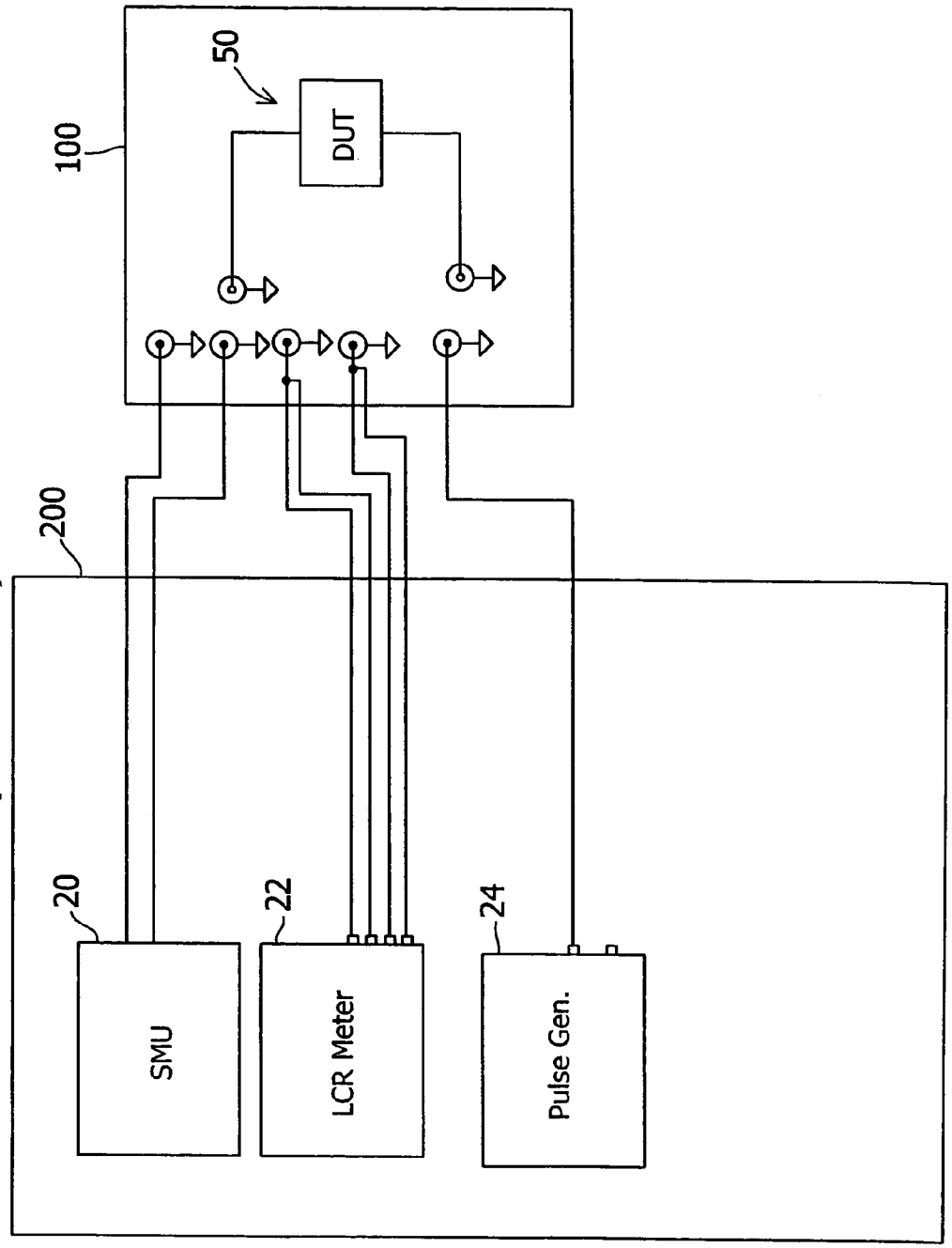
FIG. 1 is a block diagram showing the configuration of a known semiconductor-device characteristic measurement apparatus.
Figure 2:
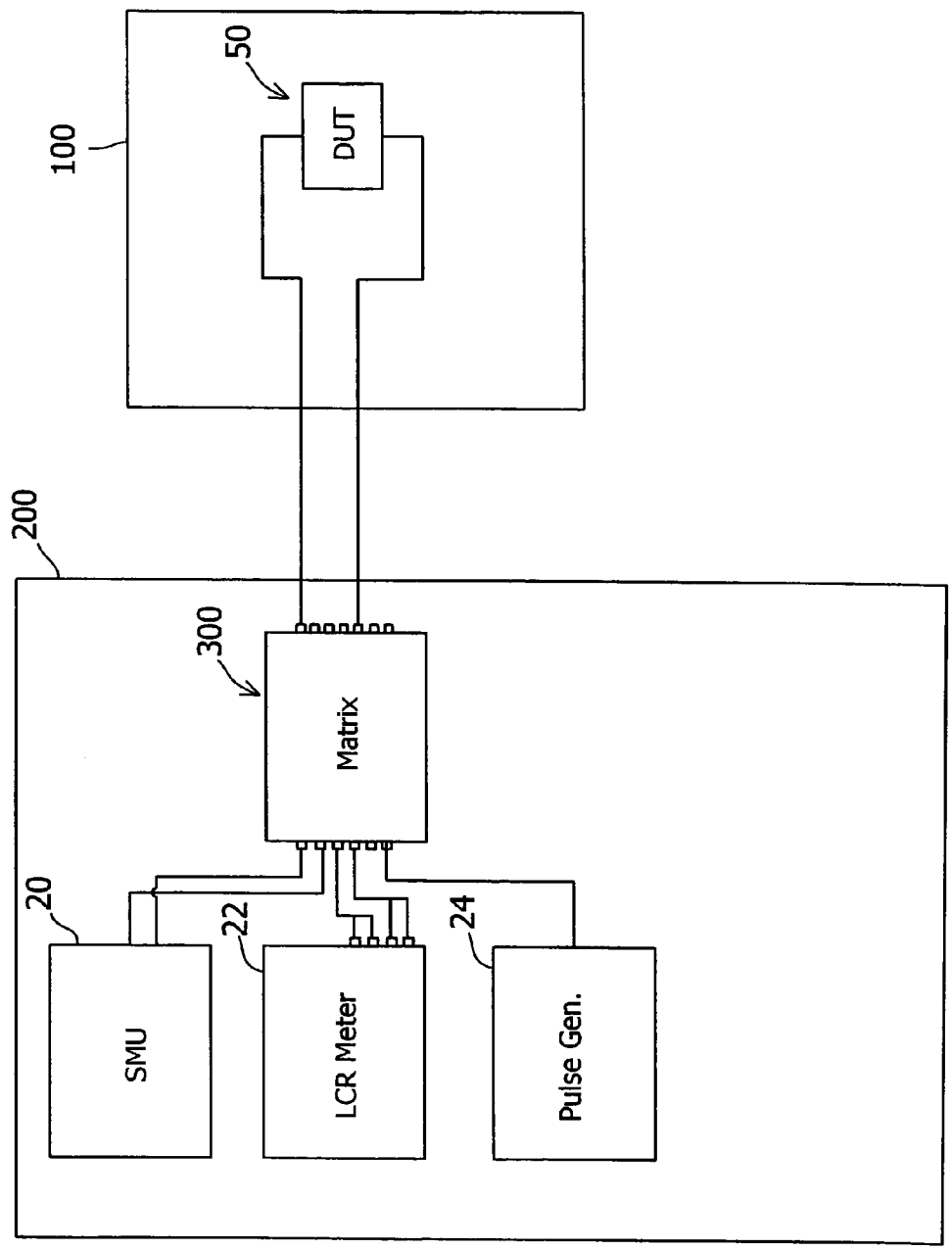
FIG. 2 is a block diagram showing the configuration of a known semiconductor-device characteristic measurement apparatus using a switching matrix.

Thus, the paths of the applied current, feedback current, and the voltage measurement portions of a case in which the LCR meter 24 is connected to the ASU 12P and the ASU 12M are analogous to those when the LCR meter 24 is individually used. In particular, as shown in FIG. 3, when the ASUs 12P and 12M are provided in the probe apparatus 100, additional impedances from the connection points of the current connectors, such as the HC connector 222C and the LC connector 226C, and the potential connectors, such as the HP connector 224C and the LP connector 228C, to the DUT 50 are considerably reduced compared to the known case (shown in FIG. 2) in which the switching matrix is used.

In FIG. 6, the outer conductors of the cables 30F and 32F are connected in close vicinity of the DUT 50 to the switch S9 in order to realize the feedback paths. However, to achieve such a connection may be difficult because of the mechanical configuration or the like of the apparatus. In such a case, instead of the connection described above, binding post connectors 128P and 128M may be provided at the respective ASUs 12P and 12M, which can be interconnected to realize the feedback path (indicated by a dotted line 128). Such a configuration is also effective when both of the ASUs 12P and 12M are provided in the probe apparatus 100, since the length of feedback-path portions that do not accompany the signal lines are shorter than the known case (shown in FIG. 2) in which the switching matrix is used. The connection as described above also provides an advantage in that the measurement of capacitance and the measurement of micro current can be switched without opening/closing operation of the switch S9, as described below.

[For Measuring DC Component]

A case in which a DC (direct current) component is measured in the embodiment of the present invention will now be described with reference to FIG. 7. In this case, the switch S9 is open. For measuring a DC component, it is possible to perform measurement using detecting means of the SMU 20 and measurement using the micro-current detectors 120 in the ASUs 12P and 12M.

First, measurement using the detecting means of the SMU 20 will be described with reference to FIG. 7. The figure shows a connection used for the measurement. In FIG. 7, the upper contact of the switch S2 is open and the lower contact thereof is closed and the upper contact of the switch S5 is closed and the lower contact thereof is open. That is, a wire that couples the switches S1 and the S2 is connected to the lower contact of the switch S2 so as to be electrically connected to a right-side terminal of the switch S2 whose potential is at a guard potential. With this arrangement, the wire that couples the switches S1 and S2 and the DUT 50 are at the same potential. As a result, it is possible to reduce errors due to potential fluctuation caused by floating of the wire that couples the switches S1 and S2 and due to the upper-contact induced leakage current caused by the fluctuation. Using the first and second channels, the SMU 20 can measure current through the application of a voltage to the DUT 50 and can measure a voltage through the feeding of current to the DUT 50. A triaxial cable 212 is connected to the force connector of the first channel of the SMU 20. A center conductor 2122 of the triaxial cable 212 transmits a signal for applying and feeding a voltage and current to the DUT 50. The signal is sent to the positive-side terminal of the DUT 50 via the switches S5 and S6, provided in the ASU 12P, and the center conductor 302 of the cable 30F. A guard conductor 2126 of the triaxial cable 212 is electrically connected to the guard conductor 306 of the triaxial cable 30F via the switch S7, so that leakage current resulting from the cables can be reduced. A sense signal line is connected to a node 502 at the DUT 50 side of the center conductor 304 of the cable 30F. A sense signal at the node 502 is transmitted through the triaxial cable 30S. The guard conductor of the triaxial cable 30S is electrically connected to the guard conductor 2126 of the triaxial cable 212 via the switch S7, and the configuration is such that no voltage drop due to leakage current occurs.

Measurement using the micro-current detector 120 will be described next. In this case, in FIG. 7, the upper contact of the switch S5 is open and the lower contact thereof is closed. The cable 214 is connected to the control connector provided at the first channel of the SMU 20. The control connector is fabricated with, for example, a general-purpose control and communication connector, such as a D-sub connector. The control connector has a current detection line in the wire thereof. The current detection line is used, instead of the sense terminal of each channel of the SMU 20, to receive a sense signal so as to measure current and voltage. The current detection line is connected to the micro-current detector 120 in the ASU 12P.

Figure 8:
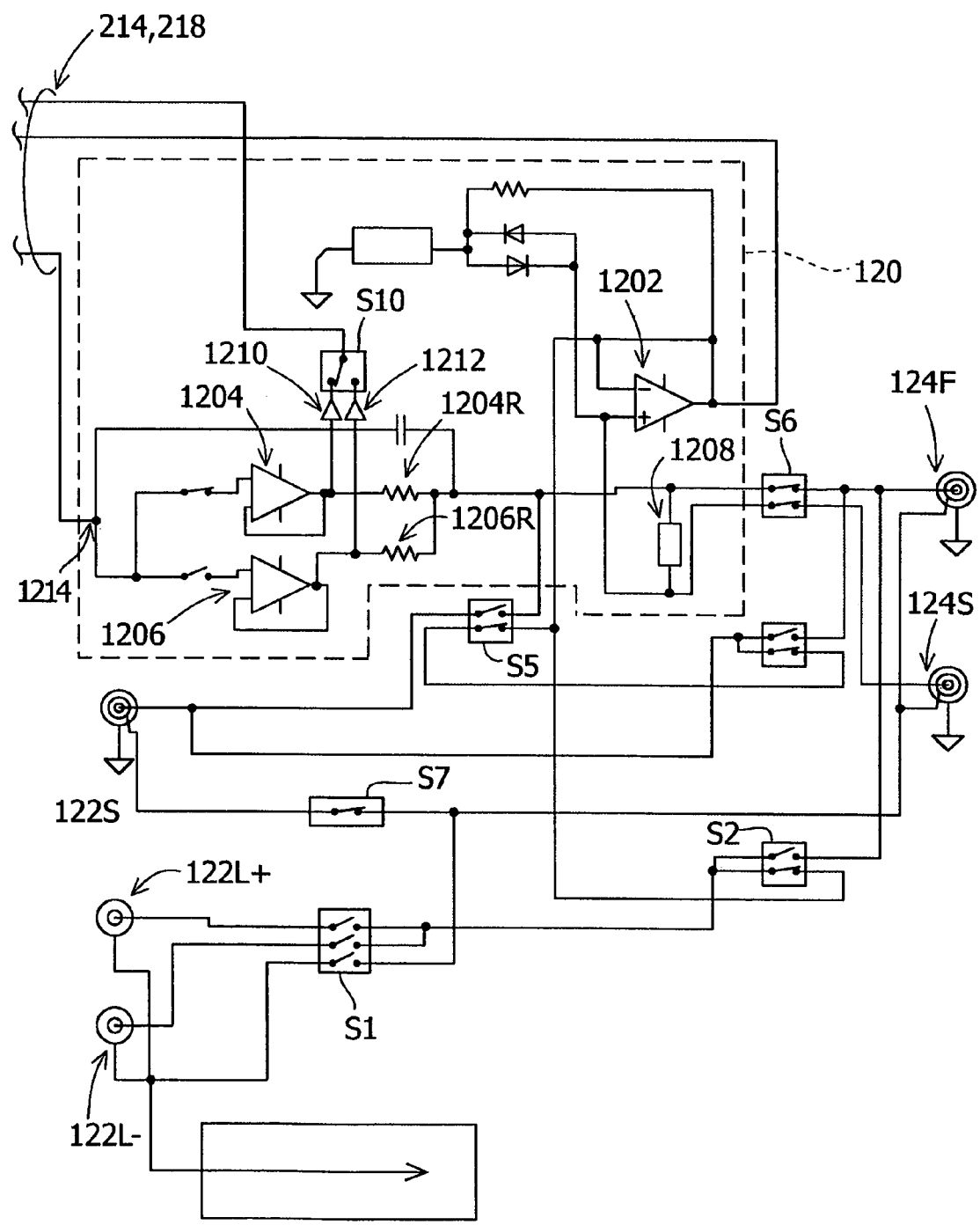
FIG. 8 is a block diagram showing the configuration of a micro-current detector in the switching means in the embodiment of the present invention.

As shown in FIG. 8, the micro-current detector 120 has first buffer amplifiers 1210 and 1212 and a second buffer amplifier 1202. The two first buffers amplifiers, i.e., the buffer amplifiers 1210 and 1212, are configured such that they can be switched by a switch S10 to change a measurement range. In operation, it is sufficient so long as one of the buffer amplifiers 1210 and 1212 is used. FIG. 8 shows the connection of relays for a case in which a measurement range using the buffer amplifier 1210 is selected. A force voltage is applied from the SMU 20 (not shown) to a terminal 1214 via the cable 214 or 218. The voltage is then transmitted to the core line of the connector 124F adjacent to the DUT 50 via a buffer amplifier 1204 or 1206 corresponding to the measurement range. For respective measurement ranges, super-high resistors 1204R and 1206R, which have known super-high resistances, are interposed in serial between the buffer amplifiers 1204 and 1206 and the DUT-side force terminal. The resistance of an impedance 1208 is low compared to the super-high resistors 1204R and 1206R. The impedance 1208 is connected to an input of the buffer 1202, so that almost no current flows in the impedance 1208. Thus, micro current that flows through the core line of the connector 124F adjacent to the DUT 50 flows via the super-high resistor 1204R or 1206R. At this point, the resistance of the super-high resistance 1204R or 1206R, which causes a voltage drop, is very high and thus causes a voltage drop that can be measured even for micro current at a level of attoampere. The first buffer amplifiers 1210 and 1212 are connected to outputs of the buffer amplifiers 1204 and 1206, respectively. The micro-current detector 120 uses the first buffer amplifiers 1210 and 1212 and the second buffer amplifier 1202 to transmit a voltage across the super-high resistor 1204R or 1206R to the cable 214 or 218. In this manner, the micro-current detector 120 is configured such that the SMU 20 measures a voltage across the super-high resistor 1204R or 1206R, whose resistor is known, thus making it possible to accurately measure micro current in the vicinity of the DUT 50. A voltage output from the buffer amplifier 1202 is transmitted to the SMU 20 via the cable 214 or 218, and is also used to perform control so that a voltage at the connector 124F reaches a desired value, when the SMU 20 applies a voltage to the terminal 1214.

Referring to FIG. 8, a wire (a first input) that provides a connection among the upper contact of the switch S6, the super-high resistor 1204R, the super-high resistor 1206R and the upper contact of the switch S5 and a wire (a second input) that provides a connection between the lower contact of the switch S6 and the positive-side input of the buffer amplifier 1202 serve as inputs for the micro-current detector 120. In addition, a wire (a first output) that sends an output of the buffer amplifier 1202 as a part of the cables 214 and 218 and a wire (a second output) that sends an output of one of the first buffer amplifiers 1210 and 1212 through switching performed by the switch S10 serve as outputs for the micro-current detector 120.

[For Supplying High-Speed Pulse to DUT]

The present invention can be used to achieve both capacitance measurement and high-accuracy DC measurement, and is also effectively used for a case in which a pulse generator is used. A configuration for a case in which a pulse generator is used will be described next with reference to FIG. 9.

Figure 9:
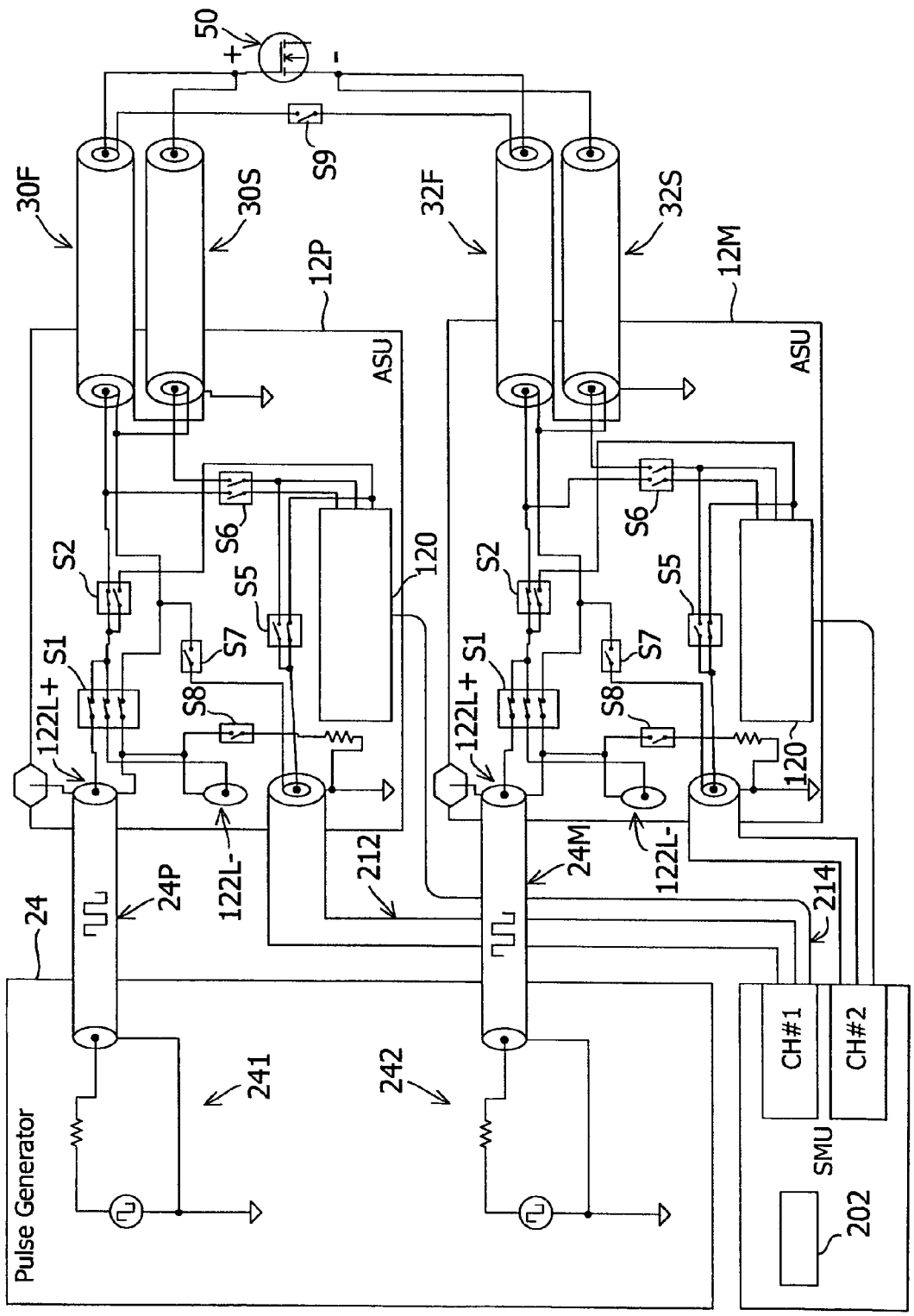
FIG. 9 is a block diagram showing the connection of the measurement apparatus and the connection apparatus when a pulse generator in the embodiment of the present invention performs measurement.

In FIG. 9, this pulse generator 24 has a first channel 241 and a second channel 242. The first channel 241 and the second channel 242 are connected to corresponding measuring-means-side connectors 122L+ of the ASUs 12P and 12M via coaxial cables 24P and 24M, respectively. The transmission of a signal from the first channel 241 of the pulse generator 24 will now be described. Inside the ASU 12P, the center conductor of the cable 24P is electrically connected to the center conductor of the triaxial cable 30F via the switches S1 and S2. The outer shield conductor of the coaxial cable 24P is electrically connected to the guard conductor of the triaxial cable 30F via the switch S1. With this arrangement, a feedback path is also realized for a path supplying a high-speed pulse to the positive side of the DUT 50. The connection for realizing the feedback path is realized by opening and closing of the switches S1 and S2 under the control of the controlling means 202. With this arrangement, a frequency-band-dependent difference of the length of the feedback paths is eliminated. Conventionally, due to skin effect, high-frequency components return through the outer shield conductor of a coaxial cable corresponding to the signal line. In such a case, the path through which the high-frequency components pass is different from a path for low-frequency components, thus causing fluctuation of a waveform.

Even with the pulse generator 24, merely controlling the switches makes it possible to switch to a path for DC measurement. The switching is achieved by, for example, causing the controlling means 202 of the SMU 20 to open the upper channel for the switch S2 and to close all the channels for the switch S6 and the upper channel for the switch S5. In this case, either one of the SMU 20 or the micro-current detector 120 can detect current, in the same manner as the case for measuring a DC component.

While FIG. 4 illustrates the switches S3 and S4 and the connector 122P for the pulse generator 24, the description here is given for the case of the connector 122L+, since it is clear that the connector 122P is electrically equivalent to the connector 122L+. Thus, the same configuration can be possible even when the switches S3 and S4 and the connector 122P for the pulse generator 24 are used. Although the above description has been given using the first channel 241 of the pulse generator 24 and the ASU 12P, the cable 24M and the ASU 12M, which operates in the same manner as the ASU 12P, may be used to allow a high-speed pulse to be applied to the negative side of the DUT 50 via the second channel 242 of the pulse generator 24.

[Configuration of Single Channel for Supplying High-Speed Pulse to DUT]

Figure 10:
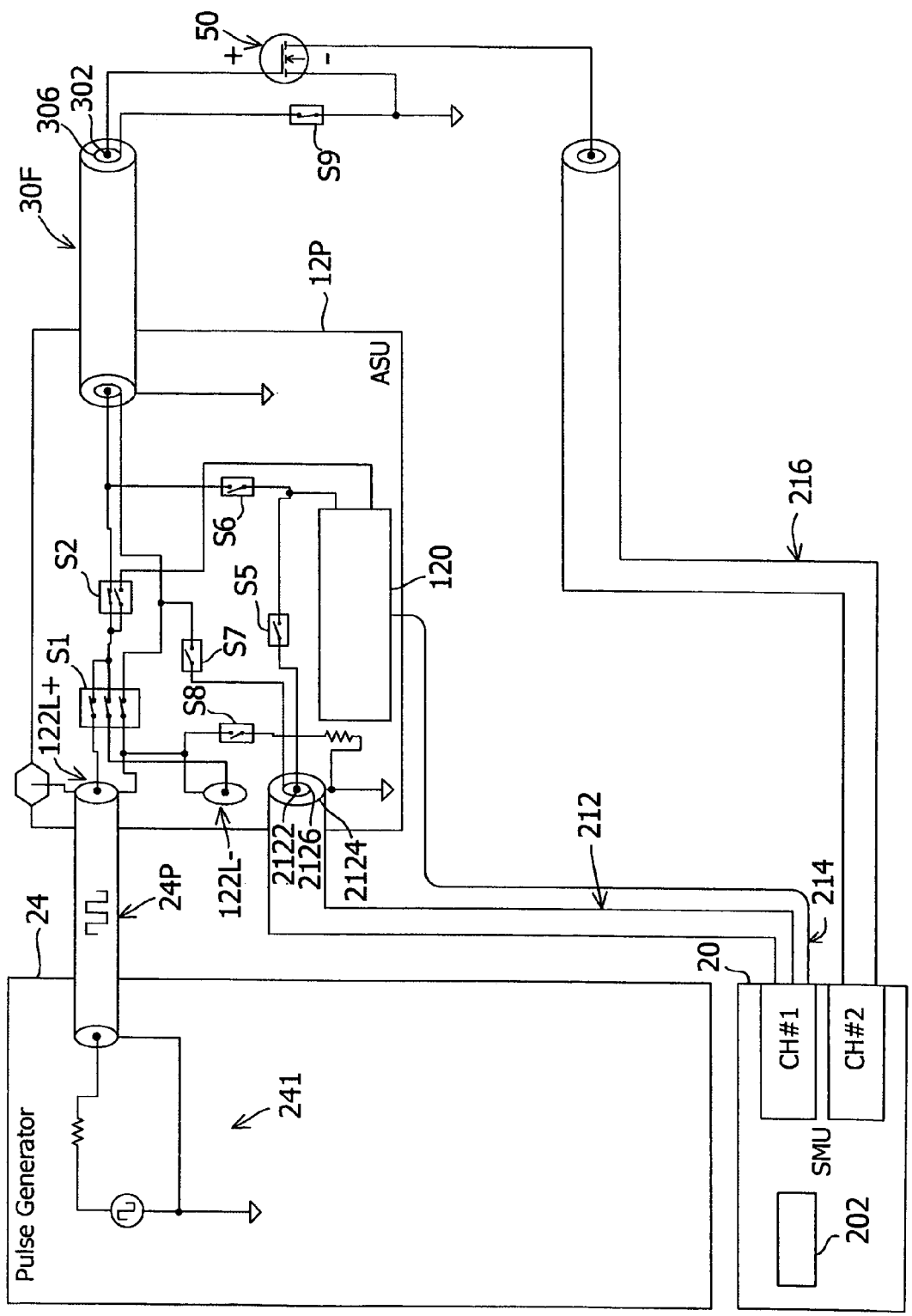
FIG. 10 is a block diagram showing the connection of the measurement apparatus and the connection apparatus when the pulse generator in the embodiment of the present invention performs measurement via a single channel.

FIG. 10 shows a configuration in which only the first channel 241 of the pulse generator 24 is used to apply a pulse to the DUT 50 and the SMU 20 is used to perform measurement, while the probe apparatus 100 probes three connectors of the DUT 50. In this case, a description is given of an example in which the DUT 50 is an IGFET (insulated gate field-effect transistor). The first channel of the SMU 20 serves to control the ASU 12P in this case. Thus, the cable 214 is connected to allow control of the ASU 12P.

One end of the center conductor of the coaxial cable 24P is connected to a signal line of one channel of the pulse generator 24, and the other end of the center conductor is electrically connected to the center conductor 302 of the triaxial cable 30F via the connector 122L+ and the switches S1 and S2 of the ASU 12P. The center conductor 302 of the triaxial cable 30F is electrically connected a positive-side gate electrode of the DUT 50. One end of the outer shield conductor of the coaxial cable 24P is connected to a common line of the channel of the pulse generator 24, and the other end of the outer shield conductor is electrically connected to the guard conductor 306 of the triaxial cable 30F via the connector 122L+ and the switch S1 of the ASU 12P. The guard conductor 306 of the triaxial cable 30F is electrically connected to a negative-side source electrode of the DUT 50 via the switch S9 that is closed. The triaxial cable 216, which is connected to the second channel of the SMU 20, is electrically connected to a negative-side drain electrode of the DUT 50. With such connections, a pulse can be applied to the DUT 50 by using only the first channel 241 of the pulse generator 24 to allow the SMU 20 to perform measurement.

Also in this case, as described with reference to FIG. 7, DC components can be measured with the SMU 20. In this case, in the configuration shown in FIG. 10, the controlling means 202 of the SMU 20 performs control so as to open all the switches S1 and S2, to close the switches S5 and S6, and to open the switch S9. In this case, in FIG. 10, measurement is performed on the section between the positive-side gate electrode and the negative-side drain electrode of the DUT 50 but not on the source electrode thereof. Which of the measurement terminals are probed can be selected as needed. As in the case of FIG. 7, it is possible to perform measurement using the detecting means of the SMU 20 and measurement using the micro-current detector 12 constituted by the ASUs 12P and 12M.

[Measurement Using Preamplifier]

Figure 11:
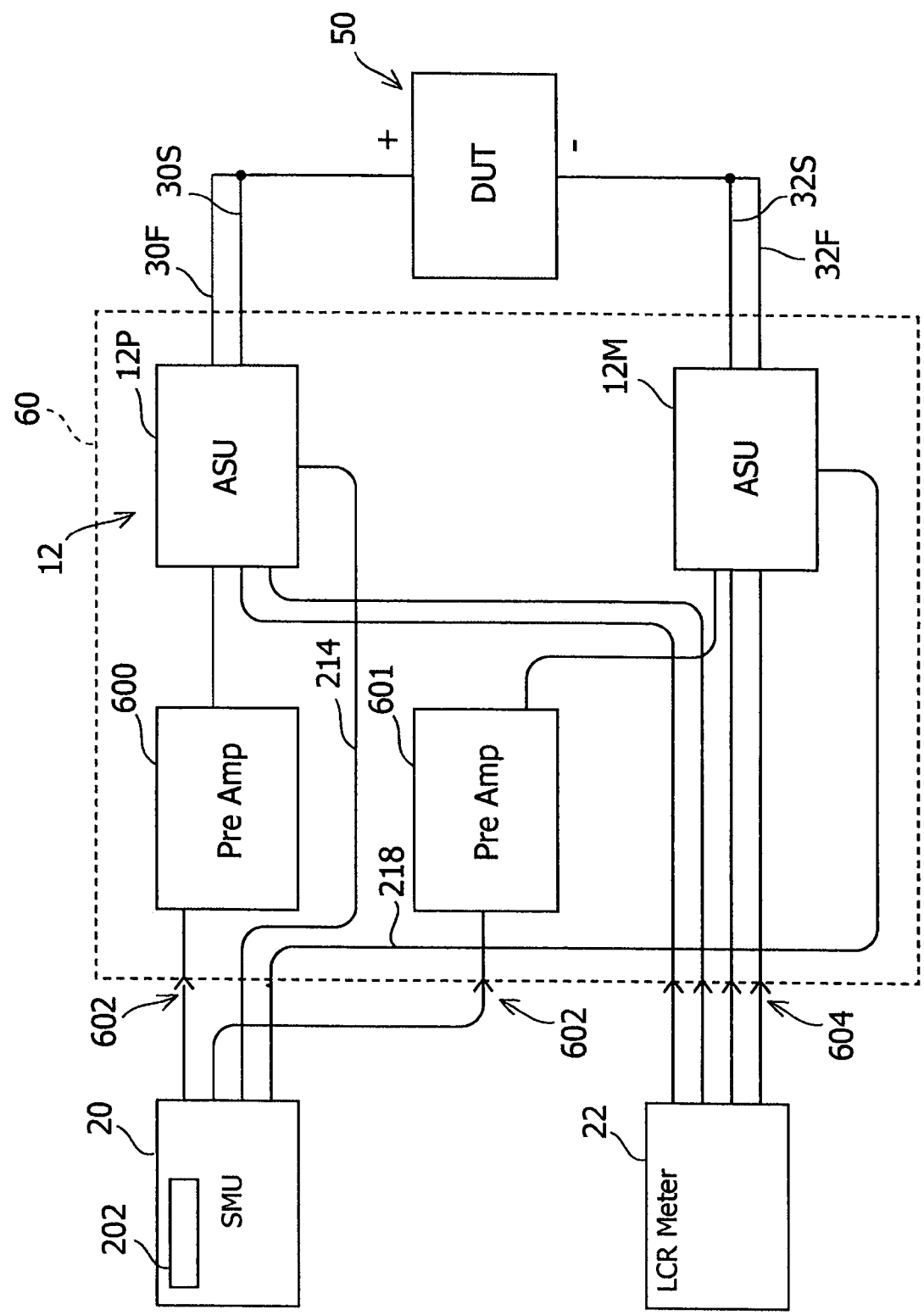
FIG. 11 is a block diagram showing the configuration of a connection apparatus, which uses preamplifiers, according to an embodiment of the present invention.

Next, a connection apparatus, which uses preamplifiers, according to an embodiment of the present invention will be described with reference to FIG. 11. In this embodiment, preamplifiers 600 and 601 are provided to amplify current or voltage signals to be supplied to the first measuring means. Amplifiers or the like that amplify current and/or a voltage can be used for the preamplifiers 600 and 601. The preamplifiers 600 and 601 are connected to the switching means 12P and 12M, respectively. Connectors (first connecting means) 602 and connectors (second connecting means) 604 are provided in this embodiment. The connectors 602 are connected to the respective preamplifiers 600 and 601 and are also connected to the first measuring means (e.g., the SMU 20) for measuring a first electrical characteristic of the DUT 50. The connectors 604 are connected to the switching means and are also connected to the second measuring means (e.g., the LCR meter 22) for measuring a second electrical characteristic of the DUT 50. The switching means 12 can perform switching such that either the connectors 602 or the connectors 604 are electrically connected to the DUT 50, in accordance with the switching signal sent from the controlling means 202.

Some illustrative embodiments according to the present invention have been described in the above. It is apparent to those skilled in the art that various improvements can be made to the embodiments without substantially departing from the novel disclosure and advantages of the present invention. It is, therefore, intended that such improvements are also encompassed by the claims of the present invention.

What is claimed is:

1. A semiconductor-device characteristic measurement apparatus, comprising:

first measuring means for measuring a first electrical characteristic of a device under test, which is a semiconductor device;

second measuring means for measuring a second electrical characteristic of the device under test;

switching means for switching between the first measuring means and the second measuring means such that one of the measuring means is connected to the device under test;

and controlling means for controlling the switching means by supplying a control signal;

wherein the switching means comprises at least one switch that switches between a first wiring configuration for electrically connecting the first measuring means to the device under test and a second wiring configuration for electrically connecting the second measuring means to the device under test in accordance with the control signal supplied from the controlling means, the first wiring configuration being suitable for measuring the first electrical characteristic and the second wiring configuration being suitable for measuring the second electrical characteristic; and the switching means is electrically connected to the device under test at a position closer to the device under test than the first measuring means and the second measuring means.

2. The measurement apparatus according to claim 1, wherein the switching means further comprises micro-current detecting means for detecting micro current flowing in the device under test;

the switching means switches among the first wiring configuration, the second wiring configuration, and a third wiring configuration in accordance with the control signal supplied from the controlling means; and the third wiring configuration electrically connects at least one of the first measuring means and the second measuring means to the micro-current detecting means, electrically connects the micro-current detecting means to the device under test, and is suitable for measuring the micro current in the device under test.

3. The measurement apparatus according to claim 1, wherein, when the first wiring configuration electrically connects the first measuring means to the device under test, a first signal path from the first measuring means to the device under test is accompanied by a first feedback path from the device under test to the first measuring means, the first feedback path corresponding to the first signal path; and when the second wiring configuration electrically connects the second measuring means to the device under test, a second signal path from the second measuring means to the device under test is accompanied by a second feedback path from the device under test to the second measuring means, the second feedback path corresponding to the second signal path.

4. The measurement apparatus according to claim 1, wherein the switching means comprises a first switching portion included in a first signal path connected to one terminal of the device under test and a second switching portion included in a second signal path connected to another terminal of the device under test; and the first switching portion and the second switching portion operate in conjunction with each other under control of the controlling means to switch between the first wiring configuration and the second wiring configuration.

5. The measurement apparatus according to claim 4, wherein the first switching portion and the second switching portion comprise signal feedback terminals that are connectable with each other.

6. The measurement apparatus according to claim 1, wherein the controlling means is arranged together with at least one of the first measuring means and the second measuring means to control the switching means.

7. The measurement apparatus according to claim 1, wherein the controlling means synchronizes with operation of at least one of the first measuring means and the second measuring means to perform control such that the switching means performs a switching operation.

8. The measurement apparatus according to claim 1, wherein one of the first measuring means and the second measuring means comprises at least one of an impedance measurement unit, a pulse generator, and a current-voltage characteristic measurement unit.

* * * * *